US008610459B2

(12) United States Patent
Oh et al.

(10) Patent No.: US 8,610,459 B2
(45) Date of Patent: Dec. 17, 2013

(54) CONTROLLING ON-DIE TERMINATION IN A DYNAMIC RANDOM ACCESS MEMORY DEVICE

(75) Inventors: Kyung Suk Oh, Campbell, CA (US); Ian P. Shaeffer, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/480,298

(22) Filed: May 24, 2012

(65) Prior Publication Data

US 2012/0265930 A1  Oct. 18, 2012

Related U.S. Application Data

(63) Continuation of application No. 13/180,550, filed on Jul. 12, 2011, now Pat. No. 8,188,762, which is a continuation of application No. 13/043,946, filed on Mar. 9, 2011, now Pat. No. 8,089,298, which is a continuation of application No. 12/861,771, filed on Aug. 23, 2010, now Pat. No. 7,924,048, which is a continuation of application No. 12/507,794, filed on Jul. 22, 2009, now Pat. No. 7,782,082, which is a continuation of application No. 12/199,726, filed on Aug. 27, 2008, now Pat. No. 7,602,209, which is a continuation of application No. 11/422,022, filed on Jun. 2, 2006, now Pat. No. 7,486,104.

(51) Int. Cl.
*H03K 17/16* (2006.01)

(52) U.S. Cl.
USPC .................. 326/30; 326/26; 326/82

(58) Field of Classification Search
USPC .......... 315/26, 27, 30, 83, 87; 326/26, 27, 30, 326/83, 87
See application file for complete search history.

(56) References Cited

U.S. PATENT DOCUMENTS 4,131,942 A * 12/1978 Gillett et al. .................... 714/22
5,467,455 A   11/1995 Gay et al. ..................... 395/281
(Continued)

FOREIGN PATENT DOCUMENTS

DE   102005036528   2/2007
EP      0531630 A1   3/1993
(Continued)

OTHER PUBLICATIONS

JP Response dated Aug. 15, 2012 re JP Application No. 2009-513379. 19 pages.
(Continued)

*Primary Examiner* — Don Le
(74) *Attorney, Agent, or Firm* — Charles Shemwell

(57) ABSTRACT

An integrated circuit device transmits, to a dynamic random access memory device (DRAM), a write command indicating that write data is to be sampled by a data interface of the DRAM, and a plurality of commands that specify programming a plurality of control values into a plurality of corresponding registers in the DRAM. The plurality of control values include first and second control values that indicate respective first and second terminations that the DRAM is to apply to the data interface during a time interval that begins a predetermined amount of time after the DRAM receives the write command, the first termination to be applied during a first portion of the time interval while the data interface is sampling the write data and the second termination to be applied during a second portion of the time interval after the write data is sampled.

32 Claims, 6 Drawing Sheets

(56) References Cited

U.S. PATENT DOCUMENTS

| | | | |
|---|---|---|---|
| 5,553,250 A | 9/1996 | Miyagawa et al. | 395/309 |
| 5,663,661 A | 9/1997 | Dillon et al. | 326/30 |
| 5,663,663 A | 9/1997 | Cao et al. | |
| 5,666,078 A | 9/1997 | Lamphier et al. | 327/108 |
| 5,982,191 A | 11/1999 | Starr | 326/30 |
| 5,995,894 A | 11/1999 | Wendte | 701/50 |
| 6,060,907 A | 5/2000 | Vishwanthaiah et al. | 326/87 |
| 6,069,539 A | 5/2000 | Sanders et al. | 333/22 R |
| 6,157,206 A | 12/2000 | Taylor et al. | 326/30 |
| 6,232,792 B1 | 5/2001 | Starr | 326/30 |
| 6,308,232 B1 | 10/2001 | Gasbarro | 710/100 |
| 6,356,105 B1 | 3/2002 | Volk | 326/30 |
| 6,356,106 B1 | 3/2002 | Greef et al. | 326/30 |
| 6,424,200 B1 | 7/2002 | McNitt et al. | 327/308 |
| 6,560,666 B1 | 5/2003 | Harriman et al. | 710/305 |
| 6,639,423 B2 * | 10/2003 | Martin et al. | 326/30 |
| 6,675,272 B2 * | 1/2004 | Ware et al. | 711/167 |
| 6,762,620 B2 | 7/2004 | Jang et al. | 326/30 |
| 6,781,405 B2 | 8/2004 | Rajan et al. | 326/30 |
| 6,856,169 B2 | 2/2005 | Frans et al. | 326/82 |
| 6,894,691 B2 | 5/2005 | Juenger | 345/531 |
| 6,924,660 B2 | 8/2005 | Nguyen et al. | 326/30 |
| 6,965,529 B2 | 11/2005 | Zumkehr et al. | 365/189.05 |
| 6,980,020 B2 | 12/2005 | Best et al. | 326/30 |
| 6,981,089 B2 | 12/2005 | Dodd et al. | 710/308 |
| 7,102,200 B2 | 9/2006 | Fan et al. | 257/379 |
| 7,103,792 B2 | 9/2006 | Moon | 713/500 |
| 7,123,047 B2 | 10/2006 | Lim | 326/30 |
| 7,148,721 B2 | 12/2006 | Park | 326/30 |
| 7,342,411 B2 | 3/2008 | Vergis et al. | 326/30 |
| 7,414,426 B2 | 8/2008 | Cox et al. | 326/30 |
| 7,516,281 B2 | 4/2009 | LaBerge | |
| 2002/0178318 A1 | 11/2002 | Muff | 710/305 |
| 2003/0012046 A1 | 1/2003 | Lee et al. | 365/63 |
| 2003/0016550 A1 | 1/2003 | Yoo et al. | 365/63 |
| 2003/0039151 A1 | 2/2003 | Matsui | 365/194 |
| 2004/0098528 A1 | 5/2004 | Janzen | 710/305 |
| 2004/0201402 A1 | 10/2004 | Rajan et al. | 326/30 |
| 2004/0228196 A1 | 11/2004 | Kwak et al. | 365/230.3 |
| 2005/0212551 A1 | 9/2005 | So et al. | 326/30 |
| 2005/0226080 A1 | 10/2005 | Lee | 365/230.03 |
| 2005/0228912 A1 | 10/2005 | Walker et al. | 710/107 |
| 2005/0264316 A1 | 12/2005 | Atkinson | 326/30 |
| 2006/0007761 A1 | 1/2006 | Ware et al. | 365/194 |
| 2006/0071683 A1 | 4/2006 | Best et al. | 326/30 |
| 2006/0077731 A1 | 4/2006 | Ware et al. | 365/194 |
| 2007/0007992 A1 | 1/2007 | Bains et al. | 326/30 |
| 2007/0070717 A1 | 3/2007 | Kim | 365/189.07 |
| 2007/0247185 A1 | 10/2007 | Oie et al. | 326/30 |
| 2009/0201711 A1 | 8/2009 | Solomon et al. | 365/51 |
| 2009/0303802 A1 | 12/2009 | Lee | 365/189.05 |
| 2009/0313410 A1 | 12/2009 | Jeong et al. | 710/300 |
| 2010/0226185 A1 | 9/2010 | Lee | 365/189.05 |
| 2011/0057720 A1 | 3/2011 | Komyo et al. | 327/551 |

FOREIGN PATENT DOCUMENTS

| | | |
|---|---|---|
| EP | 0693730 A1 | 1/1996 |
| JP | 07-084863 | 3/1995 |
| JP | 10-198473 | 7/1998 |
| JP | 2003-283322 | 10/2003 |
| TW | 2005-119471 | 12/2005 |
| WO | WO 97/02658 | 1/1997 |
| WO | WO 98/04041 | 1/1998 |
| WO | WO 00/41300 | 7/2000 |
| WO | WO 00/70474 | 11/2000 |
| WO | WO 2004-061690 A3 | 7/2004 |
| WO | WO 2007-078496 | 1/2007 |

OTHER PUBLICATIONS

Exhibit 10 U.S. Appl. No. 60/061,770, filed Oct. 10, 1997, Barth et al., related to U.S. Patent No. 7,330,953. pp. 76.

JP Response Argument and Amendment dated Apr. 16, 2012 to the Office Action dated Jan. 18, 2012 in JP Application No. 2009-513379. 46 pages.

EP Extended EP Search Report dated May 3, 2012 re EP Application No. 11193683.7. 6 Pages.

JP Office Action dated May 17, 2012 re JP Application No. 2009-513379. 2 pages.

JP Response Argument and Amendment dated May 16, 2012 to the Office Action dated Jan. 18, 2012 in JP Application No. 2009-513379. 46 pages.

Johnson, Chris. "The Future of Memory: Graphics DDR3 SDRAM Functionality." Micron Designline, vol. 11, Issue 4, 4Q02, Oct. 2002. 8 pages.

"JEDEC Standard—DDR2 SDRAM Specification" JESD-2B (Revision of JESD79-2A), JEDEC Solid State Technology Association. Jan. 2005. 112 pages.

Johnson, Chris, "Graphics DDR3 On-Die Termination and Thermal Considerations." Micron Designline, vol. 12, Issue 1. Rev. Apr. 1, 2003, 1Q03/2Q03. 8 pages.

Kyungki-Do, Yongin-Si, Korea (R.O.K.), Samsung Electronics Co., Ltd., Application Note GDDR2 ODT On/Off Control Method (Single Rank/Dual Rank), Product Planning & Application Eng. Team, Jul. 2003. 12 pages.

Farrell, Todd, "Core Architecture Doubles MEM Data Rate," in Electronic Engineering Times Asia, Dec. 16, 2005. 4 pages.

512M bits DDR3 SDRAM, Preliminary Data Sheet, Elpida Memory, Inc. 2005-2006, Document No. E0785E11 (ver. 1.1), Feb. 2006, www.elpida.com. 4 pages.

Janzen, Jeff, "DDR2 Offers New Features and Functionality," Designline, vol. 12, Issue 2, Micron, Jul. 31, 2003 EN.L. 16 pages.

Weidlich, Rainer, "What comes Next in Commodity DRAMS—DDR3," Infineon Technologies, Jun. 2005. 4 pages.

Hynix and DDR3, Keynote Address at JEDEX Shanghai 2005, Oct. 2005. 24 pages.

Micron Technical Note, "DDR2-533 Memory Design Guide for Two-DIMM Unbuffered Systems," TN-47-01, 2003. 19 pages.

Shen, Dr. William Wu, Infineon Technologies, "System Challenges on DDR3 High Speed Clock/Address/Command Fly-by Bus Topology," JEDEX San Jose, Apr. 18, 2006. 47 pages.

Rhoden, Desi and Lee, D.Y., "DDR/DDR2/DDR3 SDRAM Tutorial Sponsored by," Samsung and Inphi, JEDEX San Jose, Oct. 25-26, 2005. 130 pages.

Rhoden, Desi, "The Evolution of DDR," Via Technology Forum 2005, Inphi Corp., drhoden@inphi-copr.com. 23 pages.

Shen, Dr. William Wu, "DDR3 Functional Outlook," JEDEX San Jose, Apr. 2006. 31 pages.

Shen, Dr. William Wu, "DDR3 Functional Outlook," Infineon, JEDEX Shanghai, Oct. 25-26, 2005. 30 pages.

Lee, K.H., "MultimediaCard Solutions of Digital Storage Applications," Samsung Electronics, JEDEX Shanghai, Oct. 26, 2005. 28 pages.

Samsung, "512Mb E-die DDR3 SDRAM Specification", Preliminary Specification, Rev. 0.5, Dec. 2006. 55 pages.

Gervasi, Bill "DRAM Module Market Overview," SimpleTech, JEDEX Shanghai, Oct. 25-26, 2005. 50 pages.

Trost, Hans-Peter "Press Presentation DDR3 Introduction," Memory Products Group, Infineon Technologies, AG, Jun. 2005. 11 pages.

Micron Technical Note, TN-47-07: DDR2 Simulation Support; Rev A Jul. 2005. 4 pages.

DDR2 ODT Control; Product Planning & Application Engineering Team, Dec. 2004. 8 pages.

Nanya Technology Corp., "512Mb DDR2 SDRAM," Preliminary Specification, Nanya Technology Corp., Dec. 18, 2003, Rev. 0.2. 80 pages.

Invitation to Pay Additional Fees and Communication Relating to the Results of the Partial International Search in International Application PCT/US2007/069471, European Patent Office, Jan. 16, 2008. 8 pages.

International Search Report and the Written Opinion of the International Searching Authority for International Application RBS2.P057WO, European Patent Office, Apr. 7, 2008. 18 pages.

European Patent Office, Munich, Germany, International Preliminary report on Patentability, Jul. 23, 2008. 9 pages. (PCT/US2007/069471).

(56) References Cited

OTHER PUBLICATIONS

EP Partial European Search Report with mail date of Nov. 11, 2009, for Patent Application 09163220.8. 4 pages.
EP Extended Search Report with mail date of Jan. 29, 2010 re EP Application No. 09163220.8. 9 pages.
EP Response dated Apr. 7, 2010 re EP Application No. 07853485.6-2212 to the Official Communication dated Dec. 8, 2009, includes New claims 1-13 (clear and highlighted amendments) and New description pp. 2, 2a. 14 Pages.
EP Office Communication pursuant to Article 94(3) EPC with mail date of Aug. 12, 2009 for Application No. 07853485.6-2212. 3 pages.
CN First Office Action dated Aug. 4, 2010 in CN Application No. 200780020133.3. 11 pages.
EP Office Communication Pursuant to Article 94(3) EPC, dated Sep. 28, 2010 in EP Application No. 09163220.8. 1 page.
CN Response dated Dec. 20, 2010 re CN Application No. 200780020133.3. 7 Pages.
JP Request dated Apr. 9, 2009 for Examination and a Voluntary Amendment re JP Application No. 2009-513379. 17 Pages.
CN Office Action dated Feb. 21, 2011 re CN Application No. 200780020133.3. 6 Pages.
EP Response dated Mar. 31, 2011 to the Official Communications dated Jan. 29, 2010 and Sep. 28, 2010. 29 Pages.
CN Response dated Mar. 29, 2011 to the Second Office Action dated Feb. 21, 2011 re CN Application No. 200780020133.3. 12 Pages.
JP Office Action dated Jan. 18, 2012 in JP Application No. 2009-513379, including English language translation. 9 pages.
EP Partial European search report dated Mar. 7, 2012 re EP Application No. 1193654.8. 6 pages.
EP Response to Official Communication dated Jun. 4, 2012 and the extended EP Search Report dated Oct. 10, 2012 re EP Application No. 11193683.7. 16 Pages.
EP Extended European search report dated Dec. 12, 2012 re EP Application No. 11193654.8. 11 pages.
EP Examination Report dated May 31, 2013 in EP Application No. 11193683.7. 5 pages.
EP Response to the Official Communication dated Jan. 21, 2013 and the extended EP Search Report dated Dec. 18, 2012 for EP Application No. 11193654.8 dated Jul. 15, 2013. 21 Pages.
Invitation from European Patent Office pursuant to Article 94(3) and Rule 71(1) EPC regarding EP Application No. 11193683.7-1956. Mail date Aug. 8, 2013, 3 pages.
Applicant's Response to Aug. 8, 2013 European Patent Office Invitation re EP Application No. 11193683.7-1956, including replacement claims 1-29 (clear and with highlighted amendments) and replacement description pp. 2, 8 and 14; Response date Oct. 2, 2013, 15 Pages.

\* cited by examiner

CONTROLLING ON-DIE TERMINATION IN A DYNAMIC RANDOM ACCESS MEMORY DEVICE

CROSS REFERENCE TO RELATED APPLICATIONS

This application is a continuation of U.S. patent application Ser. No. 13/180,550, filed Jul. 12, 2011 now U.S. Pat. No. 8,188,762 and entitled "Controlling Dynamic Selection of On-Die Termination," which is a continuation of U.S. patent application Ser. No. 13/043,946, filed Mar. 9, 2011 and entitled "Integrated Circuit Device with Dynamically Selected On-Die Termination" (issued as U.S. Pat. No. 8,089, 298), which is a continuation of U.S. patent application Ser. No. 12/861,771, filed Aug. 23, 2010 and entitled "A Memory Controller That Controls Termination in a Memory Device" (issued as U.S. Pat. No. 7,924,048), which is a continuation of U.S. patent application Ser. No. 12/507,794, filed Jul. 22, 2009 and entitled "Memory-Module Buffer with On-Die Termination" (issued as U.S. Pat. No. 7,782,082), which is a continuation of U.S. patent application Ser. No. 12/199,726, filed Aug. 27, 2008 and entitled "Controlling Memory Devices That Have On-Die Termination" (issued as U.S. Pat. No. 7,602,209), which is a continuation of U.S. patent application Ser. No. 11/422,022, filed Jun. 2, 2006 and entitled "Integrated Circuit with Graduated On-Die Termination" (issued as U.S. Pat. No. 7,486,104). Each of the foregoing applications is hereby incorporated by reference.

TECHNICAL FIELD

The present invention relates to high-speed signaling systems and components.

BACKGROUND

High-speed signal lines are commonly terminated by resistive loads selected to match the characteristic impedance of the signal lines and thereby cancel undesired reflections. Historically, the terminating elements have been implemented by discrete resistors connected to metal traces on a mother board or other printed circuit board. More recently, particularly in the domain of high-bandwidth memory systems, on-die termination structures have been provided, for example, on the integrated circuit die of a memory device or memory controller.

FIG. 1 illustrates a prior-art memory system 100 that employs an on-die termination scheme. The memory system 100 includes a memory controller 101 and pair of memory modules 103A and 103B, with each memory module coupled in parallel to a shared data path 102 (DATA), and each memory module (103A, 103B) coupled to a termination control line (TC1, TC2, respectively) to enable receipt of respective termination control signal from the memory controller. As shown in detail view 106, each of the memory devices 105 within a given memory module 103 includes a set of data input/output (I/O) circuits $107_1$-$107_N$ having a data signal transceiver 109 (i.e., output driver and signal receiver coupled to provide inbound data to and receive outbound data from I/O logic/memory core circuitry 115) and a switched termination structure 111 coupled in parallel to a respective data line $117_1$-$117_N$ of data path 112 (Data[N:1]), where data lines $117_1$-$117_N$ of data path 112 constitutes a subset of the data lines within data path 102. The switched termination structures 111 themselves each include a respective load element (R) coupled to the corresponding data line via a switch element (X), with each of the switch elements within the memory devices of a given memory module 103 coupled to a common termination control input, TC, to receive an incoming termination control signal. By this arrangement, the memory controller 101 may assert the termination control signal supplied to either of the memory modules 103 (i.e., via termination control lines TC1 and TC2) to switchably connect the load elements within the constituent memory devices of the memory module to respective lines of the data path 102. During write operations in which data is output onto the data path 102 to be received within a selected one of the memory modules (103A or 103B), the memory controller 101 asserts a termination control signal on the termination control line coupled to the non-selected memory module, thereby terminating the data path stub coupled to that memory module and suppressing undesired reflections. At the same time, the memory controller 101 deasserts the termination control signal supplied to the selected memory module thereby isolating the data path 102 from the on-die terminations within the memory devices 105 of that memory module to avoid undue signal attenuation. This operation of the memory controller is shown at 120 of FIG. 1.

Analysis shows that, unfortunately, the single-termination scheme of FIG. 1 may yield sub-optimal signaling performance due, at least in part, to impedance discontinuity that tends to result at the selected memory module when the on-die terminations within that module are decoupled from the data path 102. On the other hand, asserting the termination control signal at the selected memory module tends to unduly attenuate the incoming data signals, reducing signaling margin and increasing the likelihood of signaling errors.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
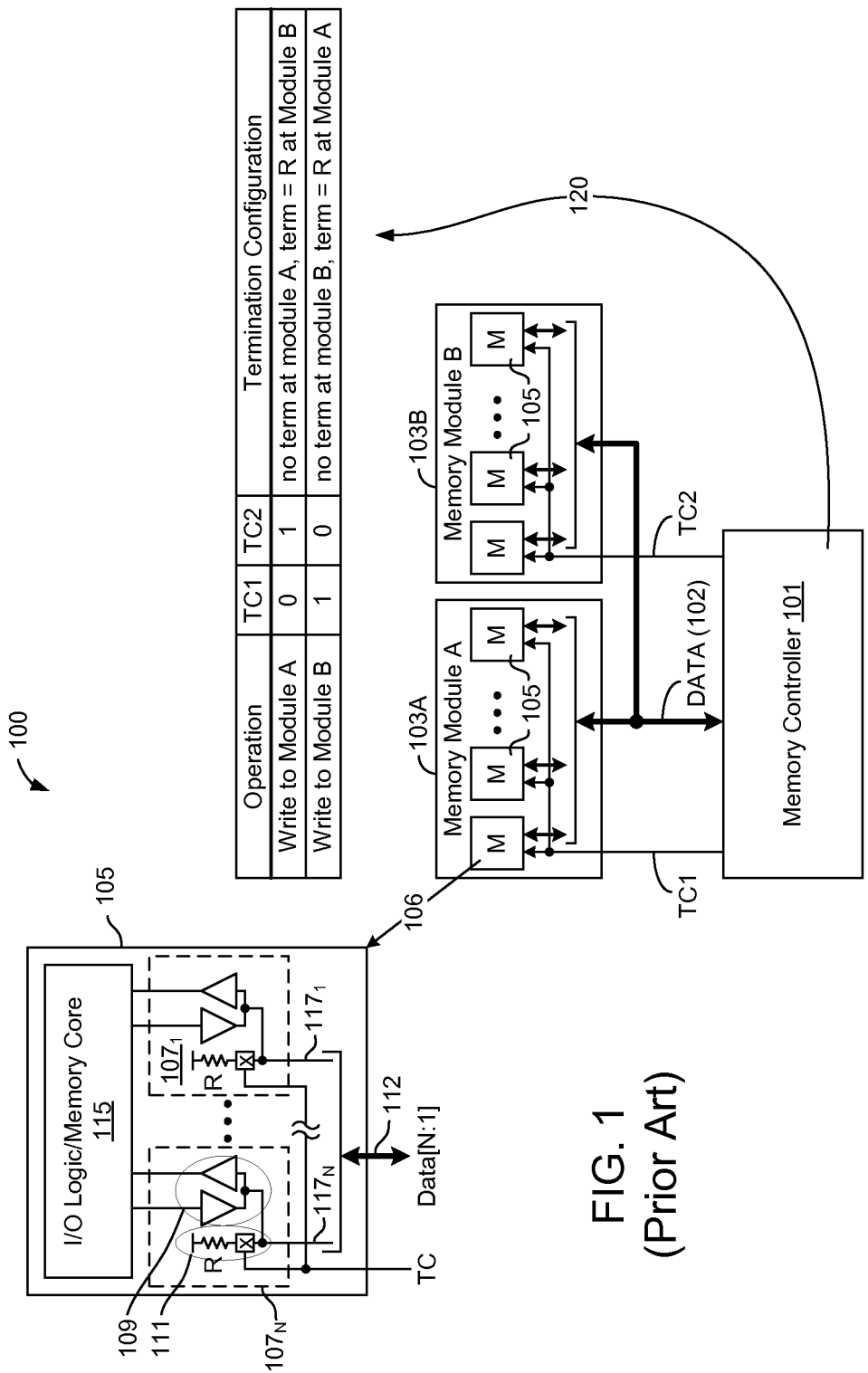
FIG. 1 illustrates a prior-art memory system that employs an on-die termination scheme.

Signaling systems having improved signaling characteristics that result from multiple, graduated on-die terminations are disclosed in various embodiments. In one embodiment, each memory device within a multiple-module memory system includes multiple on-die termination structures per incoming high-speed signal line to enable any of multiple different termination loads to be switchably coupled to the signal line according to whether the memory module is a destination for incoming signals. For example, in a particular embodiment, each memory device within a two-module memory system includes two termination structures per incoming data line, with the load elements within the two termination structures being implemented by or programmed to have different impedance values, thereby enabling selection between a relatively high-load termination and a relatively low-load termination within a given memory module according to whether the memory module is the destination for high-speed signals. Thus, during a write operation, the high-load terminations, referred to herein as hard terminations, may be switchably connected to the high-speed signaling lines within the memory devices of the non-selected (e.g., non-addressed) memory module to provide transmission line load-matching, while the low-load termination, referred to herein as a soft termination, may be switchably connected to the high-speed signaling lines within the memory devices of the selected memory module to provide a desired level of energy absorption (e.g. to cancel reflections) without unduly attenuating the incoming signals. In a subsequent write operation directed to the alternate memory module, the termination selections may be quickly reversed to establish soft termination at the alternately selected memory module and hard termination at the non-selected memory module.

In one embodiment, multiple termination control lines are provided for each rank of memory devices on a memory module (a rank of memory devices being a set of one or more memory devices that are selected to receive or output data as a parallel group) to enable independent selection between soft and hard terminations therein. In an alternative embodiment, a snoop logic circuit is provided within each of the memory devices to determine whether the memory device is the target of a particular signaling transaction and to switchably couple either the soft terminations or the hard terminations to the data lines and/or other high-speed signal lines accordingly. In another embodiment, a buffer integrated circuit (IC) is provided to receive incoming signals within a memory module and to distribute the signals to one of multiple ranks of memory devices on the memory module. In such an embodiment, multiple, graduated on-die termination structures per high-speed signaling line may be provided on the buffer IC instead of, or in addition to, the memory devices. The high-speed signal lines coupled to the multiple, graduated on-die termination structures may include data signal lines, address signal lines, command signal lines (any or all of which may be time multiplexed and thus constitute a single set of signal lines) or any combination thereof. Further, a non-volatile memory such as a serial presence detect (SPD) memory may be programmed with information indicating whether the memory devices within a given memory module include support for graduated terminations. By this arrangement, a memory controller may read the SPD memory (or other characterizing circuit or storage) to determine whether graduated terminations are supported and, if so, issue termination control signals accordingly, thus enabling the memory controller to operate in either a legacy termination mode or graduated termination mode. Also, in a system having dual-rank memory modules, the termination values for each of the two ranks on a given memory module may be programmed to have low-load and high-load values, thus enabling selection between hard and soft terminations according to whether the module is the destination for high-speed signals. These and other embodiments are described in further detail below.

Figure 2:
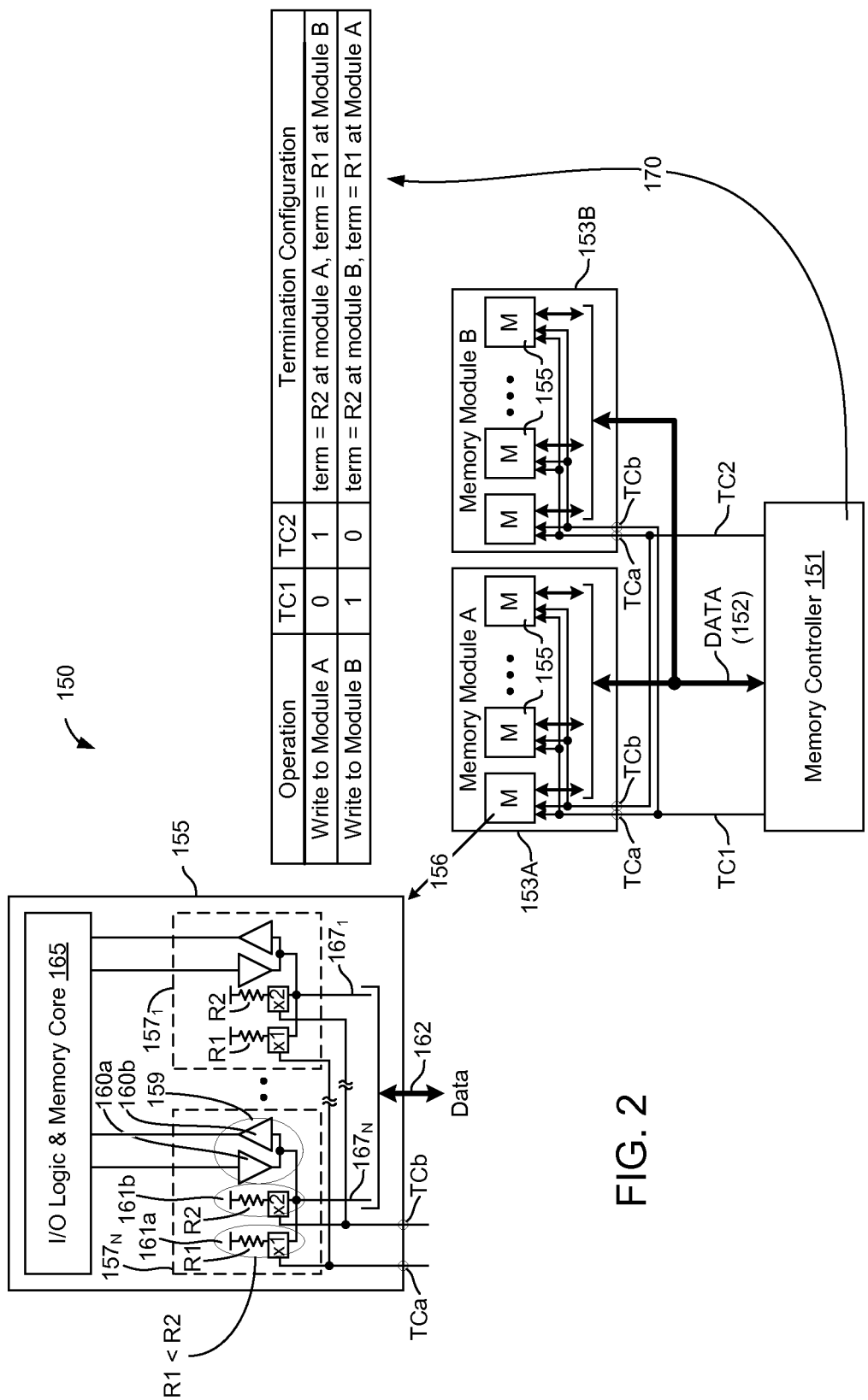
FIG. 2 illustrates an embodiment of a memory system having multiple, graduated on-die terminations per high-speed signaling line.

FIG. 2 illustrates an embodiment of a memory system 150 having multiple, graduated on-die terminations per high-speed signaling line. The memory system 150 includes a memory controller 151 coupled to two memory modules, 153A and 153B via a multi-drop data path 152 (i.e., the memory modules 153A and 153B are coupled in parallel to the data path 152), though additional memory modules may be coupled to the multi-drop data path 152 in alternative embodiments. Also, one or more additional signal paths (not shown) for conveying command, address and timing signals may be coupled between the memory controller 151 and memory modules 153.

Each of the memory modules 153 includes multiple integrated-circuit memory devices 155 coupled to respective subsets of signal lines of the data path (i.e., coupled to respective slices of the data path 152), thereby forming a memory rank. In general, the memory devices within the memory rank are accessed as a group, thus enabling transfer of N×M-bit wide read and write data words, where N is the number of data bits conveyed to or from a given memory device in a given transaction (i.e., the slice width), and M is the number of memory devices within the memory rank (i.e., the number of data path slices).

In contrast to the memory devices of FIG. 1, described above, each of the memory devices 155 within memory modules 153 includes two termination control inputs to enable reception of two independent termination control signals and thus provide for switched connection of one of two graduated termination loads (i.e., termination loads having different impedance values) to each data line of the incoming data slice. In the particular embodiment shown, termination control signals are output from the memory controller 151 on termination control lines, TC1 and TC2, that are coupled respectively to termination control inputs, TCa and TCb, of memory module 153A and, in reverse order, to termination control inputs TCb and TCa of memory module 153B. Within each of the memory modules 153, the TCa and TCb termination control inputs are coupled to corresponding TCa and TCb inputs of the individual memory devices 155. Referring to detail view 156, each of the memory devices 155 within a given module 153 includes a set of data I/O circuits $157_1$-$157_N$ having a data transceiver structure 159 (e.g., output driver 160a and signal receiver 160b coupled to provide inbound data to and receive outbound data from I/O logic and memory core 165) and a pair of switched termination structures 161a and 161b all coupled in parallel to a respective data line $167_1$-$167_N$ of data path 162, where data lines $167_1$-$167_N$ of data path 162 constitute a subset of the data lines within overall data path 152. Each of the switched termination structures 161a, 161b includes a respective load element R1, R2 coupled to the corresponding data line via a corresponding switch element X1, X2. As shown, the switch elements X1 within each of the data I/O circuits $157_1$-$157_N$ is coupled in common to termination control input TCa and the switch elements X2 are coupled in common to termination control input TCb. By this arrangement, when a termination control signal is asserted on signal line TC1, load elements R1 are switchably coupled to respective lines of the data path 152 within module 153A, and load elements R2 are switchably coupled to the respective lines of the data path within module 153B (i.e., by virtue of the swapped coupling of lines TC1/TC2 to the TCa and TCb inputs of the two memory modules 153A and 153B). Thus, by programming (or implementing) load elements R1 to have a relatively high load (i.e., a relatively low impedance) and load elements R2 to have a relatively low load (i.e., a relatively high impedance) within each of the memory devices 155, load elements R1 may be switchably coupled to the data path to effect a hard termination and load elements R2 may be switchably coupled to the data path to effect a soft termination. Accordingly, as shown by the controller operation at 170, during a write operation directed to memory module 153A, the memory controller 151 may assert a termination control signal on line TC2 (and deassert the termination control signal on line TC1) to switchably couple load elements R1 to the data path 152 within memory module 153B and to switchably couple load elements R2 to the data path 152 within memory module 153A, thus effecting a graduated termination within the selected and non-selected memory modules; that is, a soft termination in the selected memory module and a hard termination in the non-selected memory module (note that a third control state may be established by deasserting both termination control signals, thus decoupling termination loads from the data path 102 within both memory modules). When compared with the conventional on/off termination scheme described above in reference to FIG. 1, the multiple, graduated terminations generally yield larger signaling margins (i.e., more open data eyes), thus providing reduced bit error rate and additional headroom for increased signaling rates.

Still referring to FIG. 2, it should be noted that the termination structures 161a and 161b may alternatively be included within output driver 160a, in which case the output driver 160a may turn on a subset of the elements used to drive the signal line (e.g., a weaker subset of drive elements the full set used when actually driving a signal) and concurrently couple pull-up and/or pull-down termination elements to the signal line at the same time to establish the termination. Also, while a single pair of termination control lines are shown in FIG. 2 and described above (i.e., coupled to the termination control inputs TCa and TCb of memory module 153A and in reverse order to the termination control inputs of memory module 153B), a separate pair of termination control lines may be provided to each memory module in an alternative embodiment.

Figure 3:
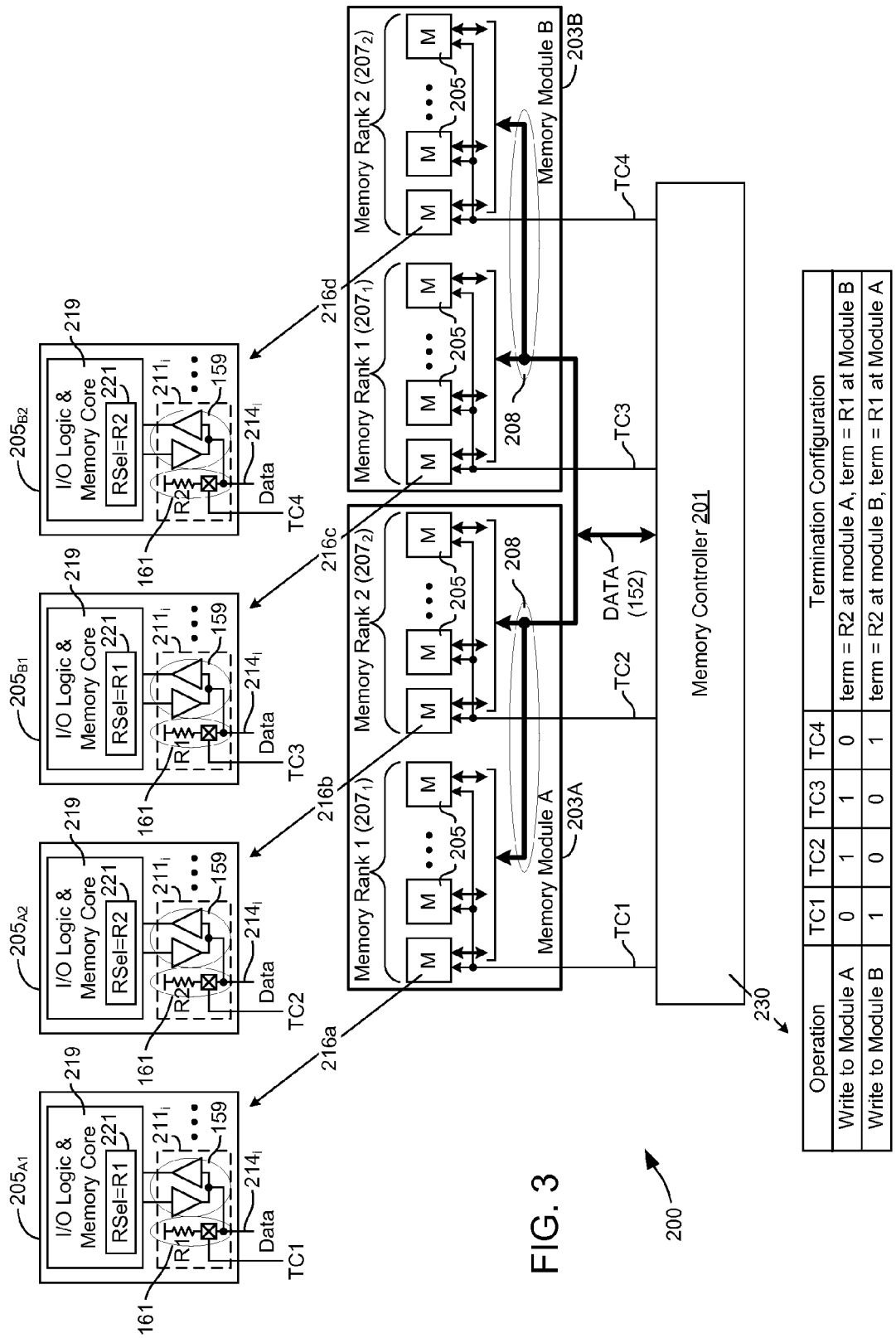
FIG. 3 illustrates an exemplary approach for achieving graduated termination within a memory system without adding additional termination structures within the constituent memory devices.

FIG. 3 illustrates an exemplary approach for achieving graduated termination within a memory system 200 without adding additional termination structures within the constituent memory devices. As shown, the memory system 200 includes a memory controller 201 coupled to two dual-rank memory modules, 203A and 203B, via a multi-drop data path 152 (though additional dual-rank memory modules 203 may be coupled to the multi-drop data path 152 in alternative embodiments and additional ranks may be provided per memory module), but with only one termination control line provided per memory rank, instead of multiple termination control lines per memory rank as in the embodiment of FIG. 2. Because the two ranks ($207_1$ and $207_2$) of memory devices 205 within a given memory module 203 are coupled in parallel to the data path 152, and the impedance of the relatively short path between them (208) is relatively small as compared to the off-module portion of the data path 152, the termination structures (or load elements thereof) within corresponding memory devices 205 within the two different ranks $207_1$ and $207_2$ may be programmed to have (or implemented with) different impedance values, and thus provide for selection between graduated termination loads. More specifically, as shown at detail views 216a and 216b, in each of the memory devices 205A within memory rank $207_1$ of module 203A may be programmed to have a relatively high termination load, R1 (i.e., low impedance) and each of the memory devices 205B within memory rank 2 of memory module 203A may be programmed to a relatively low termination load, R2, thus establishing a soft-terminated memory rank $207_1$ and a hard-terminated memory rank $207_2$ within the same memory module. Note that this arrangement is possible even within memory devices 205 that have a single termination structure (i.e., with switch X and termination load coupled in parallel with signal transceiver 159 within an I/O circuit 211) per incoming data line 214, and that the programming of soft and hard termination loads (R1 and R2) within the devices of the different memory ranks may be achieved through register programming (e.g., storing a value within register 221 within the I/O logic and memory core 219), production-time configuration (e.g., fuse, anti-fuse, non-volatile storage element, etc.) or external contact strapping. The memory devices 205 within the two memory ranks $207_1$ and $207_2$ of memory module 203B may be programmed in the same manner as shown in detail views 216c and 216d. By this arrangement, instead of deasserting termination the control signals supplied to a memory module selected to receive write data, the termination control signal that controls switched coupling of the soft-terminated memory rank $207_2$ of the selected memory module 203 may be asserted, and the termination control signal that controls switched coupling of the hard-terminated memory rank $207_1$ deasserted to establish a soft termination at the selected memory module 203, while the termination control signals supplied to the non-selected memory module are oppositely asserted and deasserted (i.e., asserting the termination control signal to engage the hard termination at memory rank $207_1$ and deasserting the termination control signal to disengage (decouple) the soft termination at memory rank $207_2$) to establish a hard termination at the non-selected memory module. Accordingly, as shown by the controller operation at 230, in a write operation directed to memory module 203A (memory module A), termination control signals are deasserted on termination control lines TC1 and TC4 (i.e., set to logic '0') and asserted on termination control lines TC2 and TC3 (set to logic '1') to switchably couple the R2 termination loads within memory rank $207_2$ of memory module 203A to the data path 152 (and switchably decouple the R1 termination loads within memory rank $207_1$) to effect soft-termination for the selected memory module, and switchably coupling the R1 termination loads within memory rank $207_1$ of memory module 203B to the data path 152 to effect hard termination for the non-selected memory module. In a write operation directed to memory module 203B, the signal levels on the termination control lines are inverted to establish soft termination (TC3=0, TC4=1) in the selected memory module 203B, and hard termination (TC1=1, TC2=0) in the non-selected memory module 203A.

In an alternative approach to that shown in FIG. 3, hard termination may be achieved by asserting both the termination control signals provided to a given memory module, in effect switchably coupling the load elements within commonly coupled termination structures of the two memory ranks $207_1$ and $207_2$ in parallel to establish an impedance R1*R2/(R1+R2) which, when R1 and R2 are programmed to (or implemented with) the same value, becomes R1/2. Thus, in such an approach, both termination control signals may be asserted simultaneously to effect hard termination within a non-selected module, while a single termination control signal is asserted to effect soft termination (R1 or R2 or, if programmed with the same value, then either of them) within the selected memory module.

Figure 4:
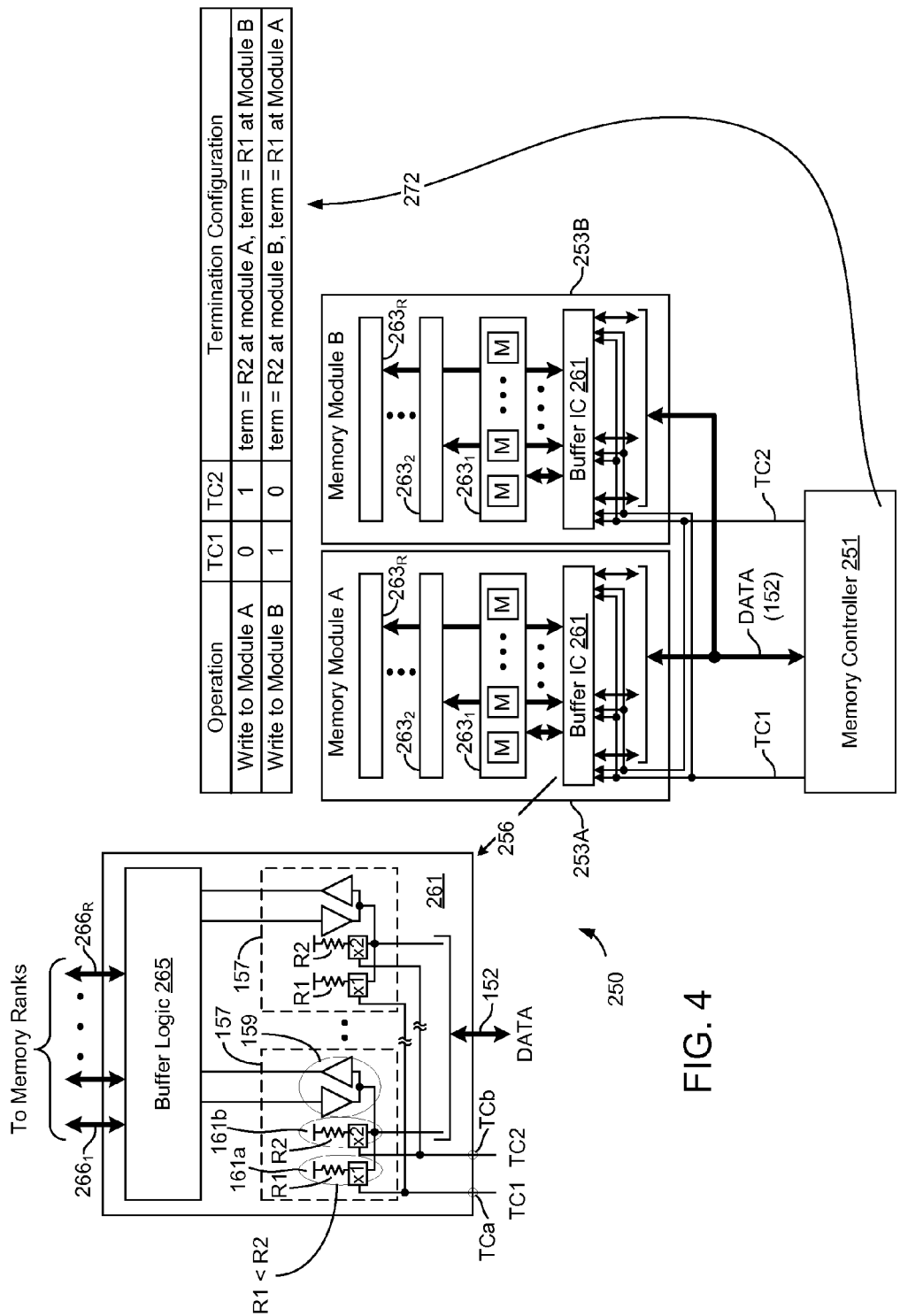
FIG. 4 illustrates an alternative embodiment of a memory system having graduated on-die terminations.

FIG. 4 illustrates an alternative embodiment of a memory system 250 having graduated on-die terminations. The memory system 250 includes a memory controller 251 coupled to memory modules 253A and 253B via a multi-drop data path 152 and termination control lines TC1 and TC2 generally as described in reference to FIG. 2. In contrast to FIG. 2, however, each of the memory modules 253 includes a buffer IC 261 that operates as an intermediary between the memory controller 251 and one or more ranks of memory devices $263_1$-$263_R$. More specifically, the buffer IC 261 includes controller interface to receive signals from and output signals to the memory controller 251 (i.e., coupled to the data path, termination control lines as well as other signal lines (not shown) for conveying command, address and timing signals to/from the memory controller 251), and multiple memory interfaces to transfer signals to and from respective memory ranks 263 (note that, in this regard, the buffer IC 261 may be implemented by multiple separate ICs, each interfacing with a respective one of the memory ranks 263 or a respective subset of the memory ranks). Each of the data paths (and/or other signal paths for conveying command, address and timing signals) coupled between a memory rank 263 and a given memory interface of the buffer IC 261 may be a point-to-point link or and may be singly or doubly terminated (i.e., termination structures coupled to one or both ends) either on die or on the memory module 253. In one embodiment, the controller interface within the buffer IC 261 is implemented in generally the manner described for the individual memory devices within the embodiment of FIG. 2. That is, each buffer IC 261 includes two termination control inputs, TCa and TCb, to enable reception of two independent termination control signals and thus provide for switched connection of one of two graduated termination loads to each high-speed signal line of the data path 152. As in the embodiment of FIG. 2, the termination control line connections between TC1/TC2 and TCa/TCb are reversed in memory module 253A relative to memory module 253B so that, when a termination control signal is asserted on line TC1, it is received via termination control input TCa in memory module 253A and via termination control input TCb in memory module 253B (as discussed above, a separate pair of termination control lines may be provided for memory module instead of a shared pair of polarity-reversed control lines). Similarly, when a termination control signal is asserted on line TC2, it is received via termination control input TCb in memory module 253A and via termination control input TCa in memory module 253B. As mentioned, multiple buffer ICs may be provided to interface with respective ranks or other groupings of memory ICs within a memory module.

Referring to detail view 256, the controller interface within each buffer IC 261 may be implemented by a set of data I/O circuits 157 that are constructed generally as described above in reference to detail view 156 of FIG. 2. That is, each I/O circuit 157 includes a data transceiver structure 159 (e.g., output driver and signal receiver) and a pair of switched termination structures 161*a* and 161*b* all coupled in parallel to a respective data line of data path 152. Each of the switched termination structures 161*a* and 161*b* includes a respective load element (R1, R2) coupled to the data line via a corresponding switch element (X1, X2). The data transceivers 159 are coupled to a buffer logic circuit 265 which operates to multiplex (e.g., switchably couple) inbound signals received from the memory controller 251 via transceivers 159 to a selected one of the memory ranks $263_1$-$263_R$ via a corresponding one of memory interfaces $266_1$-$266_R$, and to multiplex outbound signals received from one of the memory ranks $263_1$-$263_R$ to the data transceivers 159 and thus to the memory controller 251.

As in the embodiment of FIG. 2, the switch elements X1 within each of the I/O circuits 157 is coupled in common to termination control input TCa and the switch elements X2 are coupled in common to termination control input TCb. By this arrangement, and by virtue of the reversed connection of the TCa/TCb termination control inputs of memory modules 253A and 253B to termination control lines TC1 and TC2, when a termination control signal is asserted on termination control line TC1, load elements R1 are switchably coupled to respective lines of the data path 152 within memory module 253A, and load elements R2 are switchably coupled to respective lines of the data path 152 within memory module 253B. Similarly, when a termination control signal is asserted on termination control line TC2, load elements R2 are switchably coupled to the data path 152 within memory module 253A and load elements R1 are switchably coupled to the data path 152 within memory module 253B. Accordingly, by programming (or implementing) load elements R1 to have a relatively low impedance (i.e., relatively high load) and load elements R2 to have a relatively high impedance (i.e., relatively low load), load elements R1 may be switchably coupled to the data path 152 to effect hard termination and load elements R2 may be switchably coupled to the data path to effect soft termination. Thus, as shown by the controller operation at 272, during a write operation directed to memory module 253A (memory module A), a termination control signal may be asserted on line TC2 to switchably couple load elements R1 to the data path within memory module 253B, and to switchably couple load elements R1 to the data path within memory module 253A, thus effecting a graduated termination within the selected and non-selected memory modules; a soft termination within the selected memory module and a hard termination within the non-selected memory module.

Figure 5:
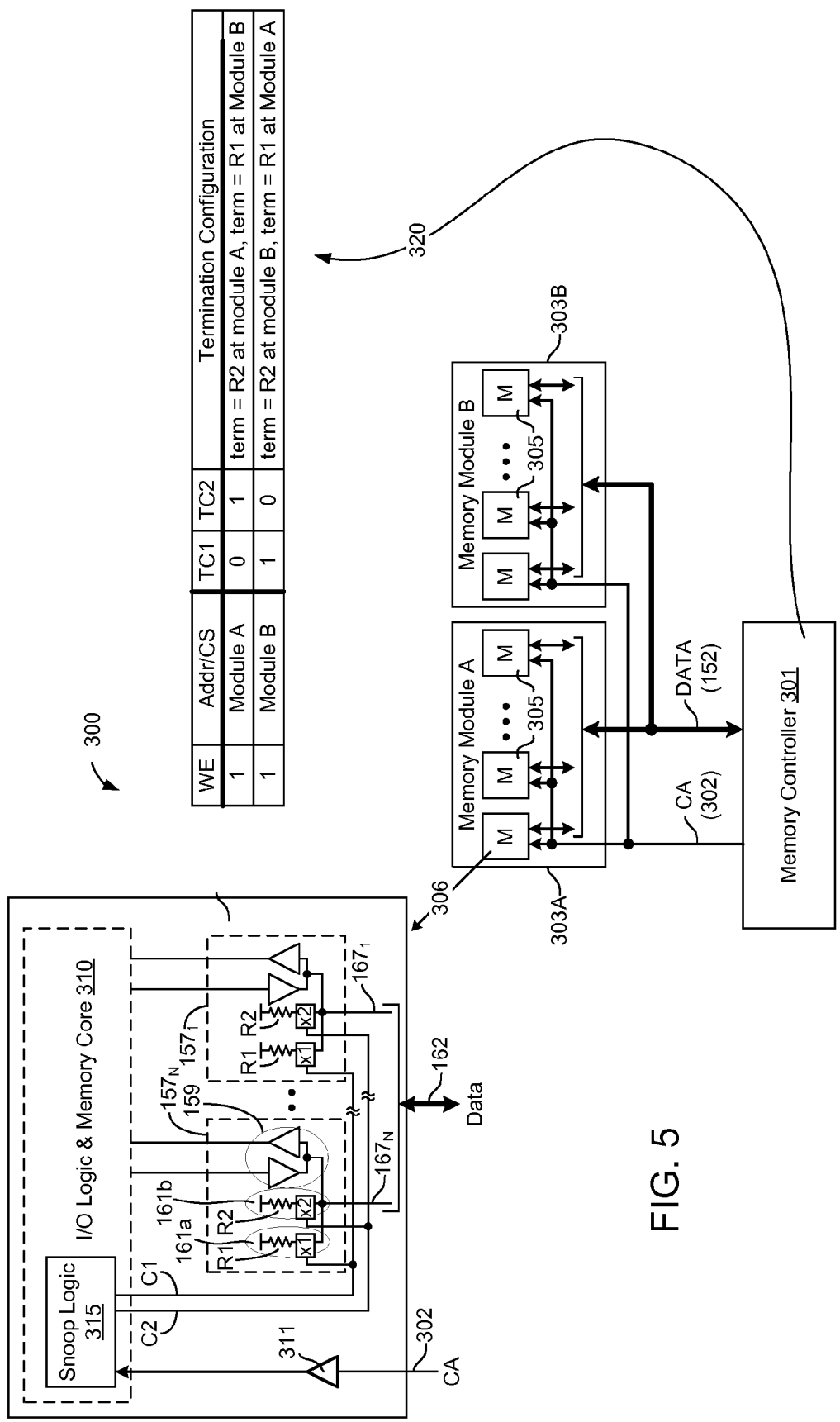
FIG. 5 illustrates another embodiment of a memory system having graduated on-die terminations.

FIG. 5 illustrates another embodiment of a memory system 300 having graduated on-die terminations. The memory system 300 includes a memory controller 301 coupled to memory modules 303A and 303B via a multi-drop data path 152, as in the embodiments described above, and also via a multi-drop command/address path 302 (CA) which may also be referred to herein as a request path (note that the command/address path may also be provided in the embodiments of FIGS. 2, 3 and 4, but is omitted to avoid obscuring other features of those embodiments). In contrast to the embodiments of FIGS. 2, 3 and 4, however, termination control lines TC1/TC2 are omitted (or at least unused) in favor of snoop logic circuitry within the memory devices 305 of memory modules 303A and 303B. In one embodiment, shown in by detail view 306 of a memory device 305, the snoop logic 315 is included with in the I/O logic and memory core circuitry 310 and is coupled via signal receiver 311 to receive all or a subset of the signals conveyed on command/address path 302. The snoop logic 315 includes circuitry to determine the nature of a requested transaction (e.g., read or write) and to compare a module selector (or module address) conveyed on the command/address path 302 with a module identifier value established for the memory module to determine whether a given memory access transaction is directed to the host memory device 305 (i.e., the memory device in which the snoop logic 315 resides) or to another memory device 305 coupled to the same data slice, and to generate control signals C1 and C2, accordingly (which control signals are supplied to respective switch elements within data I/O circuits 157 implemented as described above in reference to FIG. 2). As shown by the memory operation at 320, if the snoop logic 315 within the memory devices of memory module 303A detects a memory write transaction directed to memory module 303A (i.e., write-enable signal asserted (WE=1) and module selector=module identifier for module 303A), the snoop logic will deassert control signal C1 and assert on control signal C2 to switchably couple load elements R2 (i.e., programmed or implemented by a relatively low-load value to establish a soft termination within the selected module) to the respective lines of data path 152 and switchably decouple load elements R1 from the data path 152. During the same transaction, the snoop logic 315 within the memory devices of memory module 303B will determine that the memory write transaction is directed to another memory module (i.e., memory module A)

and, in response, assert terminal control line C2 and deassert control signal C1 to switchably couple load elements R1 to the data path 152 and switchably coupled load elements R2 from the data path 152, thereby establishing a hard termination in the non-selected memory module 303B. When the memory controller issues a memory write command directed to memory module 303B, the snoop logic circuits 315 within memory modules 303A and 303B will detect the reversed roles of the memory modules, with the snoop logic 315 within the memory devices 305 of the non-selected memory module 303A switchably coupling load elements R1 to the data path 152 to effect hard terminations and the snoop logic 315 within the memory devices 305 of the selected memory module 303B switchably coupling load elements R2 to the data path 152 to effect soft terminations.

Note that a module address may be established for the memory module through configuration register programming, production-time programming or configuration (e.g., established by a fuse, anti-fuse or other non-volatile circuit element), pin strapping, etc. Also, with respect to the signals actually snooped by snoop logic 315 to determine whether the host memory device is intended to participate in a given transaction, the snoop logic may evaluate one or all bits of an incoming address field, chip-select signals and/or any other signals that bear on whether the memory device is to respond to the incoming command.

Still referring to FIG. 5, it should be noted that snoop logic circuit 315 may be combined with explicit termination control in alternative embodiments. For example, in one such embodiment, a single termination control line is provided per memory module. A termination control signal is asserted on the termination control line to indicate that a termination should be enabled, while the snoop logic indicates the gradation of the termination to be applied (e.g., soft termination or hard termination). In another alternative embodiment, a finite state machine (FSM) may be provided in place of or in combination with snoop logic circuit 315 to determine the termination value. For example, if a given memory device (or group of memory devices) or buffer IC is expecting to receive data at the time that a termination control signal is asserted (e.g., based on a command, address value or other information received within the memory device or buffer IC a predetermined amount of time prior to transmission of the data or assertion of the control signal), the FSM may signal such expectation and thus elect to apply an appropriate one of multiple termination values. If a single termination control line is provided per module, and the termination control line to a given module is activated but no data is expected, the FSM may elect to apply a different (e.g., higher-load) termination value. A memory device or buffer IC may include an internal state machine for request/command handling purposes (and other control functions), in which case only a relatively small amount of additional logic should be needed within the state machine to select between multiple graduated terminations. Note that a state machine implementation may also be combined with snoop logic instead of or in addition to providing a dedicated termination control line. For example, a FSM within each memory module may determine the termination timing and termination value to be applied within the module according to whether the snoop logic circuit indicates the memory module to be a selected or non-selected memory module for a given transaction. In all such cases, the combination of state machine, dedicated control line input and/or snoop logic circuitry may be provided within a buffer IC as generally described in reference to FIG. 4 instead of within memory ICs.

Figure 6:
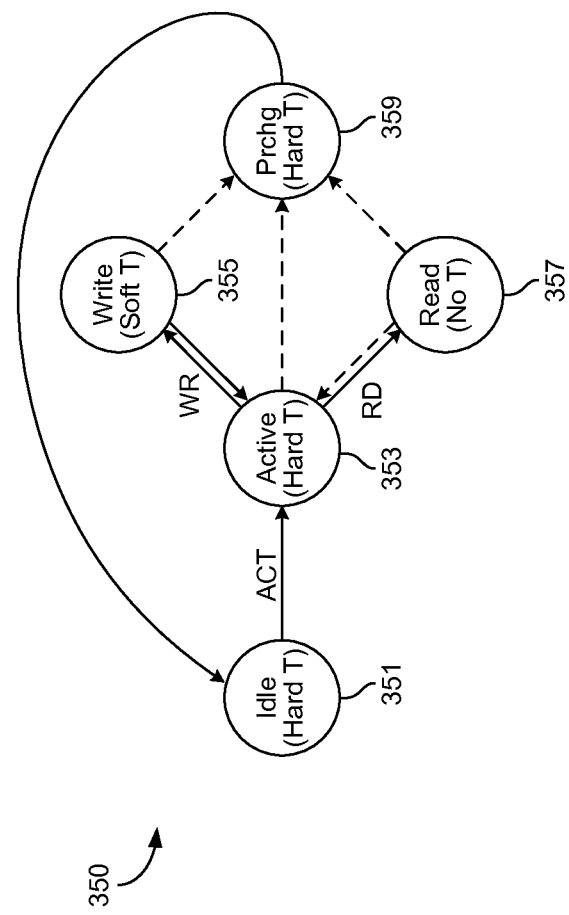
FIG. 6 illustrates an exemplary state diagram of a finite state machine that may be applied within a memory device in combination with explicit or implicit termination control detection circuitry to effect a desired one of multiple, graduated terminations.

In an embodiment in which a finite state machine or other control circuit is used instead of or in combination with snoop logic circuit 315 to determine the termination value to be applied during a given transaction, each of the individual memory devices within each memory rank may include a finite state machine that indicates the operating state of the memory device at any given time, including whether a write or read operation is currently being performed within the memory device. Accordingly, each memory device may respond to assertion of a termination control signal on a shared or dedicated termination control line (i.e., termination control line coupled in common to multiple memory ranks or a dedicated termination control line per memory rank) by effecting hard termination, soft termination or no-termination according to the present device operating state. Alternatively, each memory device may include snoop logic circuitry (e.g., generally as described in reference to FIG. 5) in addition to the finite state machine and may respond to detection of a transaction indicating need for termination control (i.e., the snoop logic, in effect, substituting for dedicated termination control lines) by effecting hard termination, soft termination or no-termination according to the present operating state. FIG. 6 illustrates an exemplary state diagram 350 of a finite state machine that may be applied within a memory device in combination with explicit or implicit termination control detection circuitry (i.e., circuitry coupled to a shared or dedicated termination control line, or snoop logic circuitry) to effect a desired one of multiple, graduated terminations. As shown, the memory devices of a given rank (the state machines of which may generally be operated in lock step) may initially be in an idle operating state 351 in which no rows of the constituent memory banks are activated. Although not specifically shown, the memory devices may transition between the idle state (or any of the other states shown in FIG. 6) and various low power states, initialization states, calibration states, configuration states (i.e., for device configuration operations, including setting of programmable registers), refresh states, etc. that are not specifically shown in FIG. 6. Because no read or write operation is occurring within the memory devices while in the idle state, detection of a termination demand (e.g., detection assertion of a dedicated or shared termination control signal or detection of information on a control and/or address path that indicates a memory read or write transaction) may be inferred to be directed to another memory rank, so that the idle-state memory devices will effect a hard termination ("Hard T"). When an activate command is received within the idle memory rank (i.e., memory rank in which the constituent memory devices are in idle state 351), the constituent memory devices perform respective row activations at the specified row and bank address (and may assume one or more intermediate operating states) and thus transition to active state 353. During the transition to the active state and while in the active state, termination demands may still be inferred to be directed to other memory ranks (i.e., because no read or write operations are occurring within the subject memory rank) so that hard termination is applied as shown. When a write command is received within an activated rank, the constituent memory devices transition to a write state 355 in which write data is delivered to the write-state memory rank and a soft termination ("Soft T") is applied to improve the signaling characteristics over the data path as described above. Note that other memory ranks may apply hard termination during transfer of the write data in accordance with their operating states. After the write operation is completed (or multiple successive write operations completed), the memory devices of the memory rank may transition to a precharge state ("Prchg") 359 (e.g., in an autoprecharge mode) or back to the active state 353. In the precharge state 359, the memory devices of the memory rank perform operations to close the open bank and precharge internal signal lines in preparation for a subsequent activation operation. Accordingly, termination demands detected while in the precharge state 359 may be inferred to be directed to other memory ranks so that hard termination is applied as shown. Referring again to active state 353, if a memory read command is received, the memory devices of the memory rank will transition to a read state 357 in which read data is output from the memory devices to a memory controller or other device. Accordingly, during the read state, the memory devices may decouple all termination elements from the data lines on which read data is being driven to avoid undue signal attenuation. As in the write state 355, other memory ranks may apply hard termination during transfer of the read data in accordance with their operating states.

It should be noted that while embodiments and approaches that include or support graduated signal terminations have been described primarily in the context of memory systems, such embodiments and approaches may readily be applied in any signaling system or components thereof in which dynamically-selected, graduated terminations may be beneficial. Also, with respect to memory systems, the nature of the core memory storage elements may vary according to application needs and may include, for example and without limitation, dynamic random access memory (dynamic RAM or DRAM) storage elements, static random access memory (SRAM) storage elements, non-volatile storage elements such as floating-gate transistors within an electrically erasable programmable read only memory (EEPROM or Flash EEPROM) or the like. With regard to implementation of on-die terminations themselves, the load elements may be implemented by virtually any type of passive components (e.g., resistors), active components (e.g., transistors or diodes) or any combination thereof, and the switch elements likewise may be implemented by transistor switches or any other on-die structures that may be used to connect or disconnect a load element from a given node. Also, while the multiple on-die termination elements or circuits have generally been depicted herein as distinct termination circuits, in all such cases two or more termination circuits may be implemented by respective load elements that include shared components. For example, a first load element within a first termination circuit may be implemented by a first set of transistors that are enabled disabled as a group to effect a first termination impedance, while a second load element within a second termination circuit may include a subset of the first set of transistors that are enabled or disabled as a group to effect a different termination impedance.

Various aspects of embodiments disclosed herein are set forth, for example and without limitation, in the following numbered clauses:

1. A memory module comprising:
    a plurality of data inputs to couple to signal lines of an external data path;
    first and second termination control inputs to receive first and second termination control signals, respectively;
    a buffer integrated circuit (IC) having a first interface coupled to the plurality of data inputs and to the first and second control inputs and having a first memory interface that includes a plurality input/output (I/O) nodes; and
    a first plurality of memory ICs, each memory IC coupled to a respective subset of the plurality of I/O nodes.
2. The memory module of clause 1 wherein the buffer IC comprises a plurality of termination circuits coupled respectively to the subset of the plurality of data inputs, each termination circuit including a first load element switchably coupled to a corresponding one of the data inputs and a second load element switchably coupled to the corresponding one of the data inputs.
3. The memory module of clause 2 wherein each of the plurality of termination circuits includes a first switch element to switchably couple the first load element to or switchably decouple the first load element from the corresponding one of the data inputs according to the state of a signal received via the first termination control input, and a second switch element to switchably couple the second load element to or switchably decouple the second load from the corresponding one of the data inputs according to the state of a signal received via the second termination control input.
4. The memory module of clause 1 wherein each memory IC of the first plurality of memory ICs comprises an array of dynamic random access memory (DRAM) storage elements.
5. The memory module of clause 1 wherein the buffer IC comprises a second memory interface, and wherein the memory module comprises a second plurality of memory ICs coupled to the second memory interface.

It should also be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which logical elements may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit device comprising:
   a first interface to transmit write data to a dynamic random access memory device (DRAM), wherein the write data is to be received by a data interface of the DRAM in response to a write command; and
   a second interface to transmit to the DRAM a plurality of commands that specify programming a plurality of control values into a plurality of corresponding registers in the DRAM, the plurality of control values including first and second control values that indicate respective first and second terminations that the DRAM is to select for application to the data interface during a time interval that begins a predetermined amount of time after the DRAM receives the write command, the first termination selected during a first portion of the time interval while the data interface is receiving the write data and the second termination selected during a second portion of the time interval after the write data is received.

2. The integrated circuit device of claim 1 wherein the second interface is additionally to assert a termination control signal at an input of the DRAM to cause the DRAM to (i) apply the first termination to the data interface while receiving the write data and (ii) apply the second termination to the data interface after receiving the write data.

3. The integrated circuit device of claim 2 wherein the second interface is to assert the termination control signal at the input of the DRAM during the first portion of the time interval and at least part of the second portion of the time interval.

4. The integrated circuit device of claim 2 wherein the second interface is to assert the termination control signal to cause the DRAM to apply the second termination prior to the time interval such that a termination sequence at the data interface includes a transition from the second termination to the first termination followed by a transition from the first termination to the second termination.

5. The integrated circuit device of claim 1 wherein the predetermined amount of time after the DRAM receives the write command is based on an amount of time that transpires between transmission of the write command and transmission of the write data.

6. The integrated circuit device of claim 1 wherein the second portion of the time interval corresponds to at least a portion of an interval in which the DRAM performs a pre-charge operation.

7. The integrated circuit device of claim 1 wherein the second interface is additionally to transmit the first control value and the second control value to the DRAM.

8. An integrated circuit device comprising:
   a termination control output to transmit a termination control signal in either a first state or a second state to a dynamic random access memory device (DRAM); and
   an interface to transmit, to the DRAM:
      a write command specifying that write data be received by a data interface of the DRAM; and
      a plurality of commands that specify programming of a plurality of control values into a plurality of corresponding registers in the DRAM, the plurality of control values indicating values of terminations that are to be applied to the data interface of the DRAM during successive time intervals if one or more predetermined conditions are met, the one or more predetermined conditions including transmission of the termination control signal in the first state to the DRAM, and wherein the terminations include a first termination that is to be applied to the data interface during a first time interval that begins a first predetermined time after the write command is received by the DRAM and a second termination that is to be applied to the data interface during a second time interval that begins a second predetermined time after the write command is received by the DRAM.

9. The integrated circuit device of claim 8 wherein transmission of the termination control signal in the second state causes the DRAM to be in a state where neither the first termination nor the second termination is applied to the data interface.

10. The integrated circuit device of claim 8 wherein the write command indicates that the write data is to be received by the data interface of the DRAM during the first time interval.

11. The integrated circuit device of claim 8 wherein the termination control output is to transmit the termination control signal in the first state throughout the first time interval and at least part the second time interval.

12. The integrated circuit device of claim 11 wherein the termination control output is additionally to transmit the termination control signal in the first state prior to the first time interval to cause the DRAM to apply the second termination prior to the first time interval such that a termination sequence at the data interface includes a transition from the second termination to the first termination followed by a transition from the first termination to the second termination.

13. The integrated circuit device of claim 8 wherein the first predetermined amount of time after the DRAM receives the write command is based on an amount of time that transpires between transmission of the write command and transmission of the write data.

14. The integrated circuit device of claim 13 wherein the second predetermined amount of time after the DRAM receives the write command is based on the amount of time that transpires between transmission of the write command and transmission of the write data plus an amount of time that transpires during transmission of the write data.

15. The integrated circuit device of claim 8 wherein the second time interval corresponds to at least a portion of an interval in which the DRAM performs a precharge operation.

16. The integrated circuit device of claim 8 wherein the interface is additionally to transmit the first control value and the second control value to the DRAM.

17. An integrated circuit device for controlling a dynamic random access memory (DRAM), the integrated circuit device comprising:
a first interface to transmit write data to the DRAM on a plurality of data lines; and
a second interface to transmit, to the DRAM:
a first control value that indicates a first termination;
a first instruction indicating that the first control value is to be stored in a first register in the DRAM;
a second control value that indicates a second termination;
a second instruction indicating that the second control value is to be stored in a second register in the DRAM;
a write command indicating that the write data is to be received during a first interval and stored within the DRAM; and
a termination control signal in either a first state or a second state wherein,
if transmitted in the first state, the termination control signal causes the DRAM to apply the first termination to the data lines throughout the first interval and the second termination to the data lines during intervals other than the first interval; and
if transmitted in the second state, the termination control signal causes the DRAM to be in a state where neither the first termination nor the second termination are applied to the data lines.

18. The integrated circuit of claim 17 wherein the first and second terminations correspond to unequal first and second impedance values, respectively.

19. The integrated circuit of claim 17 wherein the first impedance value is less than the second impedance value.

20. A method of controlling a dynamic random access memory device (DRAM), the method comprising:
transmitting to the DRAM a write command, the write command to indicate that write data is to be received by a data interface of the DRAM; and
transmitting to the DRAM a plurality of commands that specify programming a plurality of control values into a plurality of corresponding registers in the DRAM, the plurality of control values including first and second control values that indicate respective first and second terminations that the DRAM is to apply to the data interface during a time interval that begins a predetermined amount of time after the DRAM receives the write command, the first termination to be applied during a first portion of the time interval while the data interface is receiving the write data and the second termination to be applied during a second portion of the time interval after the write data is received.

21. The method of claim 20 further comprising asserting a termination control signal at an input of the DRAM to cause the DRAM to (i) apply the first termination to the data interface while receiving the write data and (ii) apply the second termination to the data interface after receiving the write data.

22. The method of claim 21 wherein asserting the termination control signal at the input of the DRAM comprises asserting the termination control signal at the input of the DRAM during the first portion of the time interval and at least part of the second portion of the time interval.

23. The method of claim 21 wherein asserting the termination control signal at the input of the DRAM comprises asserting the termination control signal to cause DRAM to apply the second termination immediately prior to the time interval such that a termination sequence at the data interface includes a transition from the second termination to the first termination followed by a transition from the first termination to the second termination.

24. The method of claim 20 wherein the predetermined amount of time after the DRAM receives the write command corresponds to an amount of time that transpires between transmission of the write command and transmission of the write data.

25. The method of claim 20 further comprising transmitting the first control value and the second control value to the DRAM.

26. A method of controlling a dynamic random access memory device (DRAM) comprising: transmitting to the DRAM a termination control signal in either a first state or a second state;
transmitting to the DRAM a write command specifying that write data be received by a data interface of the DRAM; and
transmitting to the DRAM a plurality of commands that specify programming of a plurality of control values into a plurality of corresponding registers in the DRAM, the plurality of control values indicating values of terminations that are to be applied to the data interface of the DRAM in successive time intervals if one or more predetermined conditions are met, the one or more predetermined conditions including transmission of the termination control signal to the DRAM in the first state, and wherein the terminations include a first termination that is to be applied to the data interface during a first time interval that begins a first predetermined time after the write command is received by the DRAM and a second termination that is to be applied to the data interface during a second time interval that begins a second predetermined time after the write command is received by the DRAM.

27. The method of claim 26 wherein transmitting the write command specifying that write data be received by the data interface of the DRAM comprises indicating to the DRAM that the write data is to be received by the data interface of the DRAM during the first time interval.

28. The method of claim 26 wherein transmitting the termination control signal in either the first state or the second state comprises transmitting the termination control signal in the first state throughout the first time interval and at least part the second time interval.

29. The method of claim 28 wherein transmitting the termination control signal in either the first state or the second state further comprises transmitting the termination control signal in the first state prior to the first time interval to cause DRAM to apply the second termination immediately prior to the first time interval such that a termination sequence at the data interface includes a transition from the second termination to the first termination followed by a transition from the first termination to the second termination.

30. The method of claim 26 wherein the first predetermined amount of time after the DRAM receives the write command corresponds to an amount of time that transpires between transmission of the write command and transmission of the write data.

31. The method of claim 30 wherein the second predetermined amount of time after the DRAM receives the write command corresponds to the amount of time that transpires between transmission of the write command and transmission of the write data plus an amount of time that transpires during transmission of the write data.

32. The method of claim 26 further comprising transmitting the first control value and the second control value to the DRAM.

* * * * *